(12) United States Patent
Yang

(10) Patent No.: US 11,877,467 B2
(45) Date of Patent: Jan. 16, 2024

(54) DISPLAY DEVICE

(71) Applicant: Samsung Display Co., Ltd., Yongin-si (KR)

(72) Inventor: Donghyun Yang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/878,473

(22) Filed: Aug. 1, 2022

(65) Prior Publication Data
US 2023/0036915 A1     Feb. 2, 2023

(30) Foreign Application Priority Data

Aug. 2, 2021 (KR) .................. 10-2021-0101528

(51) Int. Cl.
| | | |
|---|---|---|
| G06F 1/16 | (2006.01) | |
| H10K 50/84 | (2023.01) | |
| H10K 59/122 | (2023.01) | |
| H10K 102/00 | (2023.01) | |

(52) U.S. Cl.
CPC .......... *H10K 50/84* (2023.02); *G06F 1/1641* (2013.01); *G06F 1/1681* (2013.01); *H10K 59/122* (2023.02); *H10K 2102/311* (2023.02)

(58) Field of Classification Search
None
See application file for complete search history.

(56) References Cited

U.S. PATENT DOCUMENTS

| | | | |
|---|---|---|---|
| 7,032,984 B2* | 4/2006 | Kim | G09F 9/30 |
| | | | 49/383 |
| 9,348,450 B1* | 5/2016 | Kim | H04M 1/0268 |
| 10,912,214 B2 | 2/2021 | Kang et al. | |
| 2010/0201604 A1* | 8/2010 | Kee | G06F 1/1616 |
| | | | 345/1.3 |
| 2018/0242466 A1* | 8/2018 | Lee | G06F 1/1652 |
| 2018/0295735 A1* | 10/2018 | Ahn | H05K 5/0226 |
| 2020/0382627 A1* | 12/2020 | Park | H04M 1/0216 |
| 2021/0096600 A1* | 4/2021 | Soh | G06F 1/1616 |
| 2021/0103313 A1* | 4/2021 | Soh | G06F 1/1616 |

FOREIGN PATENT DOCUMENTS

| | | |
|---|---|---|
| KR | 10-2020-0047253 | 5/2020 |
| KR | 10-2152040 | 9/2020 |
| KR | 10-2158620 | 9/2020 |
| KR | 10-2020-0137948 | 12/2020 |
| KR | 10-2021-0038770 | 4/2021 |

* cited by examiner

*Primary Examiner* — Anthony Q Edwards
*Assistant Examiner* — Rashen E Morrison
(74) *Attorney, Agent, or Firm* — KILE PARK REED & HOUTTEMAN PLLC

(57) ABSTRACT

A display device includes a foldable display panel, a cover portion where the foldable display panel is disposed, the cover portion overlapping the foldable display panel, a hinge portion including a hinge structure connected to the cover portion to allow the cover portion to be foldable, and a hinge cover where the hinge structure is disposed, and a protection portion connected to the hinge portion and shielding an exposed side surface between the cover portion and the hinge portion.

18 Claims, 14 Drawing Sheets

DISPLAY DEVICE

CROSS-REFERENCE TO RELATED APPLICATION(S)

This application claims priority to and benefits of Korean Patent Application No. 10-2021-0101528 under 35 U.S.C. § 119, filed on Aug. 2, 2021 in the Korean Intellectual Property Office, the entire contents of which are incorporated herein by reference.

BACKGROUND

1. Technical Field

Embodiments of the disclosure relate to a display device.

2. Description of the Related Art

Electronic devices are widely used. The electronic devices, such as mobile electronic devices and fixed electronic devices, are variously used, and such electronic devices include display devices for providing, to users, visual information, such as images or videos, so as to support various functions.

Recently, with the miniaturization of components for driving display devices, proportions of the display devices occupying the electronic devices are gradually increasing, and display devices having structures that may be bendable from flat states to have certain angles are also being developed.

With the increase of consumers who value designs and convenience of the electronic devices, the designs of the electronic devices are being gradually diversified. In this regard, the display devices may include so-called foldable display devices having portions (e.g., centers) that may be folded.

The aforementioned background technology is technical information possessed by the inventor for derivation of the disclosure or acquired by the inventor during the derivation of the disclosure, and is not necessarily prior art disclosed to the public before the application of the disclosure.

SUMMARY

In a general foldable display device, a foreign material may be inserted between a hinge portion and a cover plate because a separate shield may not be provided between the hinge portion and the cover plate provided in a center folding region. The foreign material may adhere to a surface of a display panel, thereby deteriorating brightness of the display panel.

Embodiments of the disclosure provide a display device in which insertion of a foreign material into the display device may be prevented by including a protection portion.

However, such a problem is an example and problems solved by the disclosure are not limited thereto.

Additional aspects will be set forth in part in the description which follows and, in part, will be apparent from the description, or may be learned by practice of the embodiments of the disclosure.

According to an embodiment of the disclosure, a display device may include a foldable display panel, a cover portion where the foldable display panel may be disposed, the cover portion overlapping the foldable display panel, a hinge portion including a hinge structure foldably connected to the cover portion, and a hinge cover where the hinge structure may be disposed, and a protection portion connected to the hinge portion and shielding an exposed side surface between the cover portion and the hinge portion.

An end of the protection portion may be fixed to the cover portion.

The protection portion may be disposed in an internal space of the hinge cover.

The protection portion may be extracted from the hinge cover in case that the display device is folded, and the protection portion may be led into the hinge cover in case that the display device is unfolded.

The protection portion may include an elastic material.

The protection portion may include an elastic portion that extends or contracts with elasticity, and a protection plate connected to the elastic portion and the cover portion.

The protection plate may include a first protection plate connected to the elastic portion, and a second protection plate disposed in a direction opposite to the first protection plate and connected to the elastic portion.

The elastic portion may be disposed inside the hinge cover.

The elastic portion may be extended along a curvature of the hinge cover.

The display device may further include an adhesive layer between the protection plate and the cover portion to fix the protection portion to the cover portion.

The cover portion may include a combining portion with which a portion of the protection plate may be combined.

The cover portion may include a curved surface corresponding to a curved surface of the hinge cover, and the combining portion may be disposed at the curved surface of the cover portion.

An end of the protection plate may be fixed to the cover portion and may be bent in a direction from the protection plate.

The elastic portion may include a first elastic portion disposed at the hinge cover, and a second elastic portion disposed in a direction opposite to the first elastic portion, in a circumferential direction of the hinge cover.

The hinge cover may include a guide portion that guides an extraction and lead-in path of the protection plate.

The protection portion may have a curvature, and the curvature of the protection portion and a curvature of the hinge cover may be the same.

According to another embodiment of the disclosure, a display device may include a display panel including a first non-folding portion, a second non-folding portion, and a folding portion between the first non-folding portion and the second non-folding portion, a cover portion including a first cover overlapping the first non-folding portion of the display panel, and a second cover overlapping the second non-folding portion of the display panel, a hinge portion overlapping the folding portion of the display panel and foldably connecting the first cover to the second cover, and a protection portion disposed at the hinge portion, the protection portion connecting the first cover and the second cover to the hinge portion, and having a variable length.

The protection portion may shield an exposed side surface between the cover portion and the hinge portion.

The protection portion may include an elastic portion extendedly fixed to the hinge portion, and a protection plate connected to the elastic portion and connected to the first cover and the second cover.

The protection plate may be extracted from the hinge portion in case that the display device is folded, and the protection plate is led into the hinge portion in case that the display device is unfolded.

Other aspects, features, and advantages other than those described above will become apparent from the detailed description, claims and drawings for carrying out the following disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
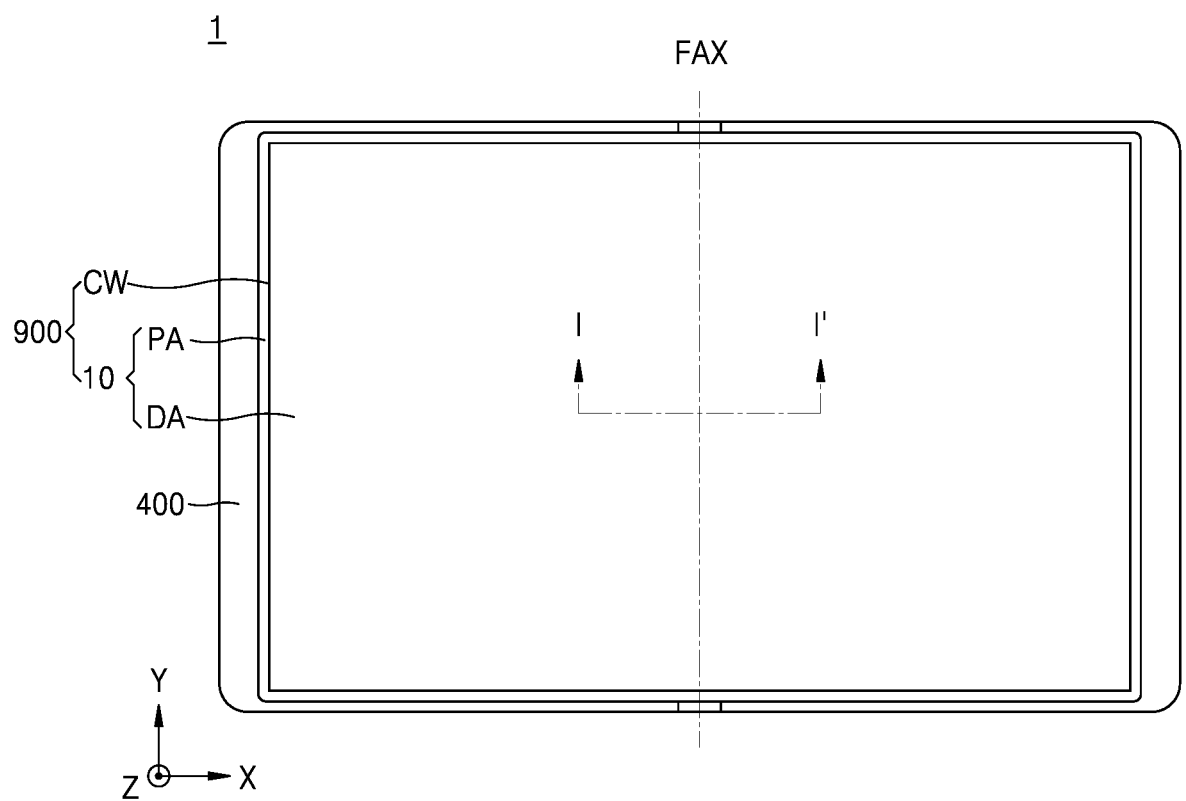
FIG. 1 is a schematic plan view of a display device according to an embodiment of the disclosure.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or." Throughout the disclosure, the expression "at least one of" is intended to include the meaning of "at least one selected from the group of" for the purpose of its meaning and interpretation. For example, "at least one of a, b and c" indicates only a, only b, only c, both a and b, both a and c, both b and c, all of a, b, and c, or variations thereof.

The disclosure may have various modifications and various embodiments, and specific embodiments are illustrated in the drawings and are described in detail in the detailed description. Effects and features of the disclosure and methods of achieving the same will become apparent with reference to embodiments described in detail with reference to the drawings. However, the disclosure is not limited to the embodiments described below, and may be implemented in various forms.

In the following embodiments, the terms "first" and "second" are not used in a limiting sense, but rather are used to distinguish one component from another component.

In the following embodiments, an expression used in the singular encompasses the expression of the plural, unless the context clearly indicates otherwise.

In the following embodiments, it will be further understood that the terms "comprise", "comprising", "has", "having", "include", and "including" specify the presence of stated features or components, but do not preclude the presence or addition of one or more other features or components.

It will be understood that when a layer, region, or element is referred to as being "formed on" another layer, area, or element, it can be directly or indirectly formed on the other layer, region, or element. For example, intervening layers, regions, or elements may be present.

In the drawings, for convenience of description, sizes of components may be exaggerated or reduced. In other words, because sizes and thicknesses of components in the drawings may be arbitrarily illustrated for convenience of explanation, the disclosure is not necessarily limited thereto.

According to embodiments, an x-axis, a y-axis, and a z-axis may not be limited to three axes on an orthogonal coordinate system, but may be interpreted in a broad sense including the three axes. For example, the x-axis, the y-axis, and the z-axis may be perpendicular to one another, or may represent different directions that may not be perpendicular to one another.

When a certain embodiment may be implemented differently, a specific process order may be performed differently from the described order. For example, two consecutively described processes may be performed substantially at the same time or performed in an order opposite to the described order.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as "not overlapping" or "to not overlap" another element, this may include that the elements are spaced apart from each other, offset from each other, or set aside from each other or any other suitable term as would be appreciated and understood by those of ordinary skill in the art.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device 1 according to an embodiment of the disclosure will be described with reference to the drawings.

Figure 2:
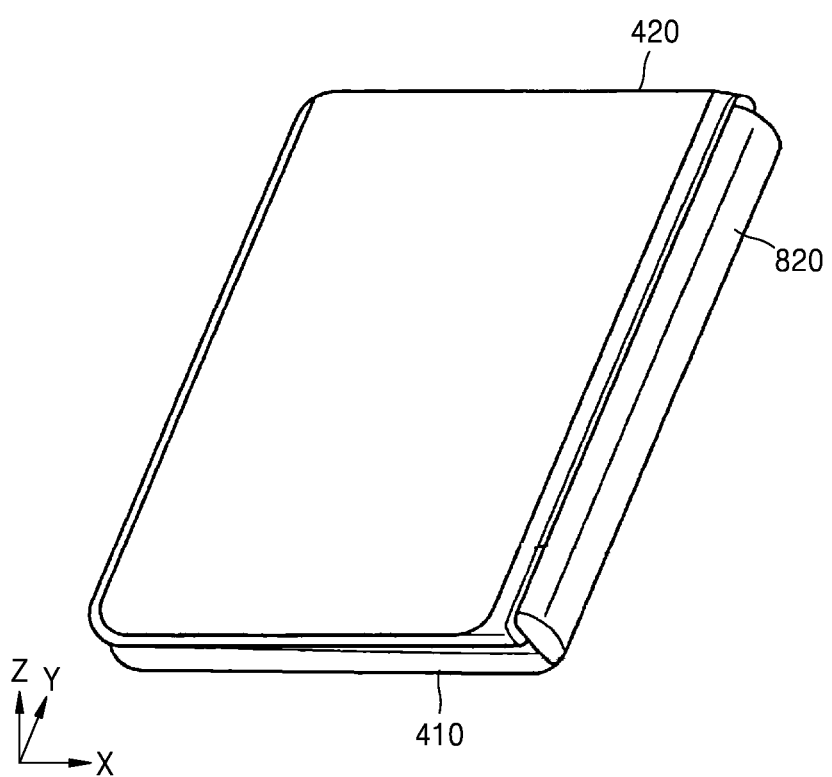
FIG. 2 is a schematic perspective view of a display device according to an embodiment of the disclosure.
Figure 3:
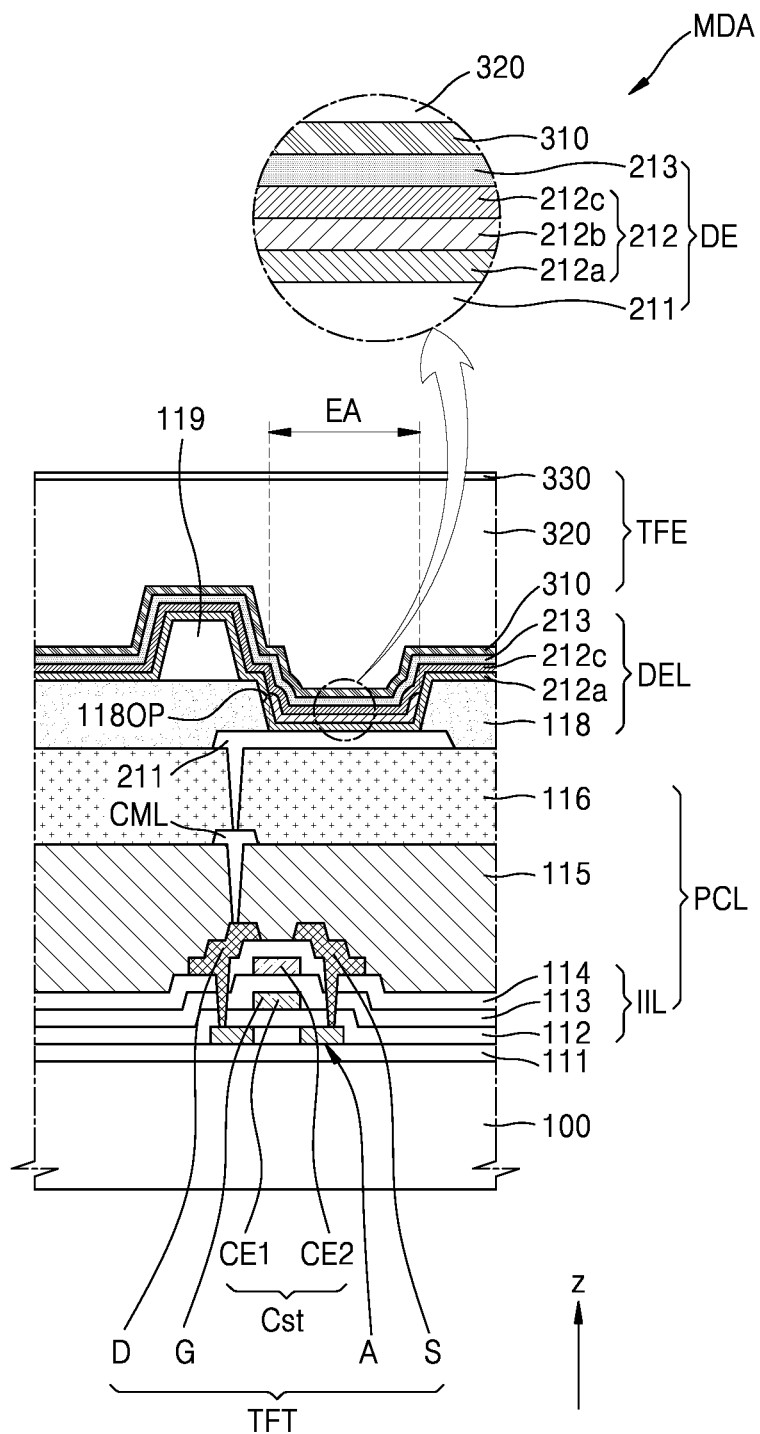
FIG. 3 is a schematic cross-sectional view of a display panel according to an embodiment of the disclosure.
Figure 4:
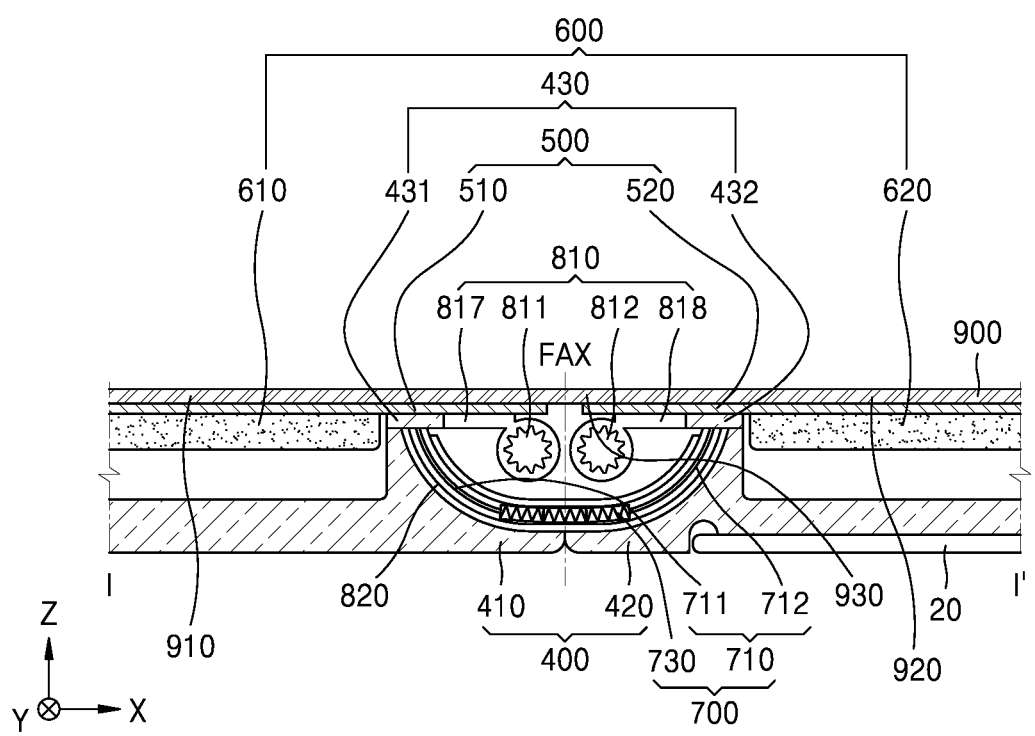
FIG. 4 is a schematic cross-sectional view of the display device taken along line I-I' of FIG. 1.

FIG. 1 is a schematic plan view of the display device 1 according to an embodiment of the disclosure, and FIG. 2 is a schematic perspective view of the display device 1 according to an embodiment of the disclosure. FIG. 3 is a schematic cross-sectional view of a display panel 10 according to an embodiment of the disclosure, and FIG. 4 is a schematic cross-sectional view of the display device 1 taken along line I-I' of FIG. 1.

Referring to FIGS. 1 through 4, the display device 1 may be a device that displays a moving image or a still image, and may be used as a display screen of not only portable electronic devices, such as a mobile phone, a smartphone, a tablet personal computer (PC), a mobile communication terminal, an electronic notebook, an electronic book, a portable multimedia player (PMP), a navigation device, and an ultra mobile PC (UMPC), but also various products, such as a television, a laptop computer, a monitor, a billboard, and an Internet of Things (IoT) device. Also, the display device 1 according to an embodiment may be used for wearable devices, such as a smart watch, a watch phone, a glasses-type display, and a head mounted display (HMD). The display device 1 according to an embodiment may be used as a panel of a vehicle, a center information display (CID) disposed (arranged) on a center fascia or dashboard of a vehicle, a room mirror display replacing a side mirror of a vehicle, or a display arranged on a rear surface of a front seat, as entertainment for a back seat of a vehicle.

According to an embodiment, the display device 1 may have a long side in a first direction and a short side in a second direction. Here, the first direction and the second direction may be directions crossing each other. For example, the first direction and the second direction may form an acute angle. As another example, the first direction and the second direction may form an obtuse angle or a right angle. Hereinafter, a case in which the first direction (for example, an X-axis direction or −X-axis direction) and the second direction (for example, a Y-axis direction or −Y-axis direction) form a right angle will be described in detail.

According to another embodiment, lengths of sides of the display device 1 in the first direction (for example, the X-axis or −X-axis direction) may be the same as lengths of sides of the display device 1 in the second direction (for example, the Y-axis or −Y-axis direction). According to another embodiment, the display device 1 may have short sides in the first direction (for example, the X-axis or −X-axis direction) and long sides in the second direction (for example, the Y-axis or −Y-axis direction).

Corners where the long sides in the first direction (for example, the X-axis or −X-axis direction) and the short sides in the second direction (for example, the Y-axis or −Y-axis direction) meet may be curved in a certain curvature.

The display device 1 may be folded based on a folding axis FAX. In case that the display device 1 is folded, the display device 1 may be folded such that display surfaces of the display device 1 face each other based on the folding axis FAX, as shown in FIG. 2 (infolding). In other embodiments, the display device 1 may be folded in a direction opposite to the infolding such that the display surfaces of the display device 1 may be externally exposed based on the folding axis FAX (outfolding).

Referring to FIGS. 1 through 4, the display device 1 may include a display module 900, a support portion 500, a buffer portion 600, a cover portion 400, a hinge portion 800, and a protection portion 700.

The display module 900 may include the display panel 10 and a cover window CW. The cover window CW may perform a function of protecting the display panel 10.

The cover window CW may be a flexible window. The cover window CW may protect the display panel 10 by being bent according to an external force without cracking or the like. The cover window CW may include plastic. The cover window CW may be, for example, ultra-thin glass (UTG) or colorless polyimide (CPI). According to an embodiment, the cover window CW may have a structure in which a flexible polymer layer may be arranged on a surface of a glass substrate or may include only a polymer layer.

The display panel 10 may be arranged below the cover window CW. Although not shown in FIGS. 1 through 4, the display panel 10 may be attached to the cover window CW via a transparent adhesive member, such as an optical clear adhesive (OCA) film.

The display panel 10 may include a display area DA displaying an image and a peripheral area PA adjacent to (surrounding) the display area DA. The display area DA may include pixels, and the image may be displayed through the pixels. The pixels may each include subpixels. For example, the pixels may each include a red subpixel, a green subpixel, and/or a blue subpixel. In other embodiments, the pixels may each include a red subpixel, a green subpixel, a blue subpixel, and/or a white subpixel.

Referring to FIG. 3, the display panel 10 may include a display element. For example, the display panel 10 may be an organic light-emitting display panel using an organic light-emitting diode including an organic emission layer as the display element. In other embodiments, the display panel 10 may be a light-emitting diode display panel using a light-emitting diode (LED). A size of the LED may be in micro-scale or nano-scale. In other embodiments, the display panel 10 may be a quantum dot light-emitting display panel using a quantum dot light-emitting diode including a quantum dot emission layer. In other embodiments, the display panel 10 may be an inorganic light-emitting display panel using an inorganic light-emitting device including an inorganic semiconductor. Hereinafter, a case in which the display panel 10 may be an organic light-emitting display panel using an organic light-emitting diode as a display element will be described in detail.

The display panel 10 may include a substrate 100, a buffer layer 111, a pixel circuit layer PCL, a display element layer DEL, and a thin-film encapsulation layer TFE.

The substrate 100 may include a polymer resin, such as polyether sulfone, polyarylate, polyetherimide, polyethylene naphthalate, polyethylene terephthalate, polyphenylene sulfide, polyimide, polycarbonate, cellulose triacetate, cellulose acetate propionate, or a combination thereof. The substrate 100 including the polymer resin may be flexible, rollable, bendable, or a combination thereof. The substrate 100 may have a multi-layer structure including a base layer including the polymer resin and a barrier layer (not shown).

The buffer layer 111 may include an inorganic insulating material, such as silicon nitride, silicon oxynitride, silicon oxide, or a combination thereof, and may be a single layer or multilayer including the above inorganic insulating material.

The pixel circuit layer PCL may be arranged on the buffer layer 111. The pixel circuit layer PCL may include a thin-film transistor TFT included in a pixel circuit, and an inorganic insulating layer IIL, a first planarization layer 115, and a second planarization layer 116, which may be arranged below and/or on components of the thin-film transistor TFT. The inorganic insulating layer IL may include a first gate insulating layer 112, a second gate insulating layer 113, and an interlayer insulating layer 114.

The thin-film transistor TFT may include a semiconductor layer A, and the semiconductor layer A may include polysilicon. In other embodiments, the semiconductor layer A may include amorphous silicon, an oxide semiconductor, an organic semiconductor, or a combination thereof. The semiconductor layer A may include a channel region, a drain region, and a source region, which may be arranged on both sides of the channel region, respectively. A gate electrode G may overlap the channel region thereof.

The gate electrode G may include a low-resistance metal material. The gate electrode G may include a conductive material including molybdenum (Mo), aluminum (Al), copper (Cu), titanium (Ti), or a combination thereof, and may include a multilayer or single layer including the conductive material.

The first gate insulating layer 112 between the semiconductor layer A and the gate electrode G may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

The second gate insulating layer 113 may be provided to overlap (cover) the gate electrode G. Like the first gate insulating layer 112, the second gate insulating layer 113 may include an inorganic insulating material, such as $SiO_2$, $SiN_x$, SiON, $Al_2O_3$, $TiO_2$, $Ta_2O_5$, $HfO_2$, and/or $ZnO_2$.

An upper electrode CE2 of a storage capacitor Cst may be arranged above the second gate insulating layer 113. The upper electrode CE2 may overlap the gate electrode G therebelow. Here, the upper electrode CE2 and the gate electrode G, which overlap the second gate insulating layer 113 therebetween, may form the storage capacitor Cst of the pixel circuit. In other words, the gate electrode G may operate as a lower electrode CE1 of the storage capacitor Cst. As such, the storage capacitor Cst and the thin-film transistor TFT may overlap each other. According to some embodiments, the storage capacitor Cst may not overlap the thin-film transistor TFT.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may be a single layer or multilayer including such a material.

The interlayer insulating layer 114 may cover the upper electrode CE2. The interlayer insulating layer 114 may include $SiO_2$, $SiN_x$, SiON, $Al_2O_3$, $TiO_2$, $Ta_2O_5$, $HfO_2$, and/or $ZnO_2$. The interlayer insulating layer 114 may be a single layer or multilayer including the inorganic insulating material described above.

A drain electrode D and a source electrode S may each be disposed (located) on the interlayer insulating layer 114. The drain electrode D and the source electrode S may include a material having good conductivity. The drain electrode D and the source electrode S may include a conductive material including Mo, Al, Cu, and/or Ti, and may include a multilayer or single layer including the conductive material. According to an embodiment, the drain electrode D and the source electrode S may have a multilayer structure of Ti/Al/Ti.

The first planarization layer 115 may cover the drain electrode D and the source electrode S. The first planarization layer 115 may include an organic insulating layer. The first planarization layer 115 may include an organic insulating material, such as a general-purpose polymer, for example, polymethylmethacrylate (PMMA) or polystyrene (PS), a polymer derivate having a phenol-based group, an acrylic-based polymer, an imide-based polymer, an aryl ether-based polymer, an amide-based polymer, a fluorine-based polymer, a p-xylene-based polymer, a vinyl alcohol-based polymer, or a blend thereof.

A connection electrode CML may be arranged on the first planarization layer 115. Here, the connection electrode CML may be connected to the drain electrode D or source electrode S via a contact hole of the first planarization layer 115. The connection electrode CML may include a material having good conductivity. The connection electrode CML may include a conductive material including Mo, Al, Cu, and/or Ti, and may include a multilayer or single layer including the conductive material. According to an embodiment, the connection electrode CML may have a multilayer structure of Ti/Al/Ti.

The second planarization layer 116 may cover the connection electrode CML. The second planarization layer 116 may include an organic insulating material. The second planarization layer 116 may include an organic insulating material, such as a general-purpose polymer, for example, PMMA or PS, a polymer derivate having a phenol-based group, an acrylic-based polymer, an imide-based polymer, an aryl ether-based polymer, an amide-based polymer, a fluorine-based polymer, a p-xylene-based polymer, a vinyl alcohol-based polymer, or a blend thereof.

The display element layer DEL may be arranged on the pixel circuit layer PCL. The display element layer DEL may include a display element DE. The display element DE may be an organic light-emitting diode OLED. A pixel electrode 211 of the display element DE may be electrically connected to the connection electrode CML via a contact hole of the second planarization layer 116.

The pixel electrode 211 may include a conductive oxide, such as indium tin oxide (ITO), indium zinc oxide (IZO), zinc oxide (ZnO), indium oxide ($In_2O_3$), indium gallium oxide (IGO), aluminum zinc oxide (AZO), or a combination thereof. According to another embodiment, the pixel electrode 211 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. According to another embodiment, the pixel electrode 211 may further include a layer formed of ITO, IZO, ZnO, and/or $In_2O_3$, on/below the reflective layer.

A pixel-defining layer 118 having an opening 1180P exposing a center portion of the pixel electrode 211 may be arranged on the pixel electrode 211. The pixel-defining layer 118 may include an organic insulating material and/or an inorganic insulating material. The opening 1180P may define an emission area EA of light emitted from the display element DE. For example, a width of the opening 1180P may correspond to a width of the emission area EA of the display element DE.

A spacer 119 may be arranged on the pixel-defining layer 118. The spacer 119 may be used to prevent damage to the substrate 100 in a method of manufacturing the display device 1. A mask sheet may be used while manufacturing the display panel 10, and at this time, the spacer 119 may prevent the mask sheet from entering into the opening 1180P of the pixel-defining layer 118 or prevent a part of the substrate 100 from being damaged or broken by the mask sheet while depositing a deposition material on the substrate 100 close to the pixel-defining layer 118.

The spacer 119 may include an organic insulating material, such as polyimide. In other embodiments, the spacer 119 may include an inorganic insulating material, such as silicon nitride or silicon oxide, or may include an organic insulating material and an inorganic insulating material.

According to an embodiment, the spacer 119 may include a material different from the pixel-defining layer 118. According to another embodiment, the spacer 119 may include a same material as the pixel-defining layer 118 and in this case, the pixel-defining layer 118 and the spacer 119 may be formed together during a mask process using a half-tone mask or the like.

An intermediate layer 212 may be arranged on the pixel-defining layer 118. The intermediate layer 212 may include an emission layer 212b arranged at the opening 1180P of the pixel-defining layer 118. The emission layer 212b may include a high-molecular weight organic material or low-molecular weight organic material, which emits light of certain color.

A first functional layer 212a and a second functional layer 212c may be respectively arranged below and on the emission layer 212b. The first functional layer 212a may include, for example, a hole transport layer (HTL) or may include an HTL and a hole injection layer (HIL). The second functional layer 212c may be a component arranged on the emission layer 212b and may be optional. The second functional layer 212c may include an electron transport layer (ETL) and/or an electron injection layer (EIL). Like an opposing electrode 213 described below, the first functional layer 212a and/or the second functional layer 212c may be a common layer formed to entirely cover the substrate 100.

The opposing electrode 213 may include a conductive material with a low work function. For example, the opposing electrode 213 may include a (semi-)transparent layer including Ag, Mg, Al, Pt, Pd, Au, Ni, Nd, Ir, Cr, lithium (Li), calcium (Ca), or an alloy thereof. In other embodiments, the opposing electrode 213 may further include a layer including ITO, IZO, ZnO, and/or $In_2O_3$, on the (semi-)transparent layer including the above material.

According to some embodiments, a capping layer (not shown) may be further arranged on the opposing electrode 213. The capping layer may include LiF, an inorganic material, and/or an organic material.

The thin-film encapsulation layer TFE may be arranged on the opposing electrode 213. According to an embodiment, the thin-film encapsulation layer TFE may include at least one inorganic encapsulation layer and at least one organic encapsulation layer, and FIG. 3 shows that the thin-film encapsulation layer TFE includes a first inorganic encapsulation layer 310, an organic encapsulation layer 320, and a second inorganic encapsulation layer 330, which may be sequentially stacked on each other.

The first inorganic encapsulation layer 310 and the second inorganic encapsulation layer 330 may include at least one inorganic material from among aluminum oxide, titanium oxide, tantalum oxide, hafnium oxide, zinc oxide, silicon oxide, silicon nitride, and silicon oxynitride. The organic encapsulation layer 320 may include a polymer-based material. Examples of the polymer-based material may include an acrylic resin, an epoxy resin, polyimide, polyethylene, or a combination thereof. According to an embodiment, the organic encapsulation layer 320 may include acrylate.

Although not illustrated, a touch electrode layer may be arranged on the thin-film encapsulation layer TFE, and an optical functional layer may be arranged on the touch electrode layer. The touch electrode layer may obtain coordinate information according to an external input, for example, a touch event. The optical functional layer may reduce reflectance of light (external light) incident from the outside towards the display device 1, and/or enhance color purity of light emitted from the display device 1. According to an embodiment, the optical functional layer may include a retarder and/or a polarizer. The retarder may be a film type or liquid crystal coating type, and may include a $\lambda/2$ retarder and/or a $\lambda/4$ retarder. The polarizer may also be a film type or a liquid crystal coating type. The film type may include an elongated synthetic resin film, and the liquid crystal coating type may include liquid crystals disposed (arranged) in a certain arrangement. The retarder and the polarizer may further include a protection film.

According to another embodiment, the optical functional layer may include a black matrix and color filters. The color filters may be arranged considering light colors emitted from the pixels of the display device 1, respectively. The color filters may each include red, green, or blue pigment or dye. In other embodiments, the color filters may each further include quantum dots in addition to the above pigment or dye. In other embodiments, some of the color filters may not include the pigment or dye, and may include scattered particles such as titanium oxide.

According to another embodiment, the optical functional layer may include a destructive interference structure. The destructive interference structure may include a first reflective layer and a second reflective layer arranged on different layers. First reflective light and second reflective light reflected respectively from the first reflective layer and the second reflective layer may destructively interfere, and accordingly, reflectance of external light may be reduced.

An adhesive member may be arranged between the touch electrode layer and the optical functional layer. A general adhesive member may be employed as the adhesive member without limitation. For example, the adhesive member may be a pressure sensitive adhesive (PSA).

Figure 5:
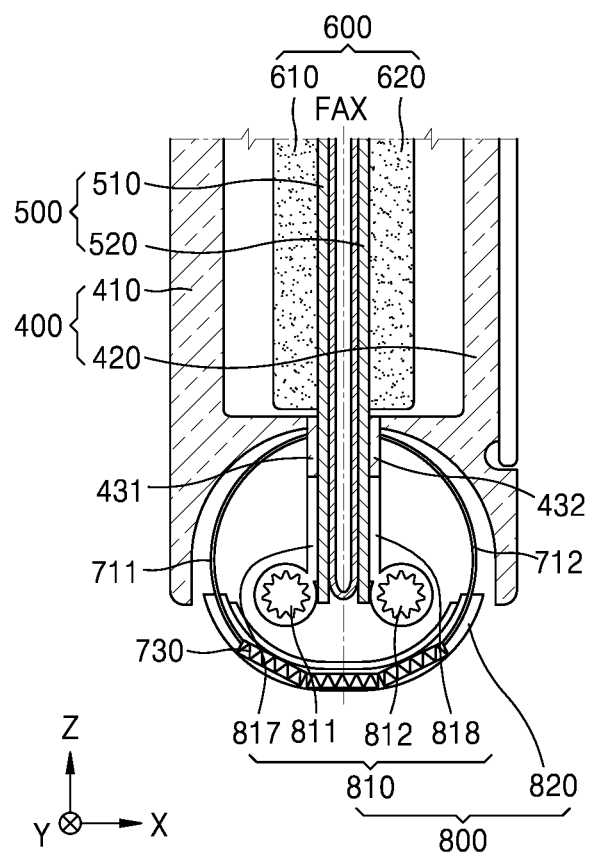
FIG. 5 is a schematic cross-sectional view of the display device of FIG. 4 being folded.

FIG. 4 is a schematic cross-sectional view of the display device 1 in an unfolded state, taken along line I-I' of FIG. 1, and FIG. 5 is a schematic cross-sectional view of the display device 1 of FIG. 4 being folded.

Referring to FIGS. 4 and 5, the display module 900 may be folded based on the folding axis FAX crossing the display area DA (see FIG. 1). Here, the folding axis FAX may be parallel to a long side or short side of the display device 1. The display module 900 may be folded such that a side surface and another side surface face each other based on the folding axis FAX.

In FIG. 1, the folding axis FAX extends from the Y-direction to the −Y-direction, but is not limited thereto, and the folding axis FAX may extend from the X-direction to the −X-direction. Also, one folding axis FAX is illustrated, but according to another embodiment, the display module 900 may be folded based on multiple folding axes FAX crossing the display area DA. Hereinafter, a case where the display module 900 may be folded based on one folding axis FAX will be described in detail.

Referring to FIG. 4, the display module 900 may include a folding portion 930, a first non-folding portion 910, and a second non-folding portion 920. The display module 900 may include the cover window CW and the display panel 10 as described above. Here, the cover window CW and the display panel 10 may each include regions corresponding to the folding portion 930, the first non-folding portion 910, and the second non-folding portion 920, respectively. The folding portion 930 may be a region folded according to the folding axis FAX in the display module 900. The first non-folding portion 910 and the second non-folding portion 920 may be regions located at a side (for example, a side in the −X-direction of FIG. 4) and another side (for example, a side in the X-direction of FIG. 4), based on the folding portion 930 in the display module 900. Here, a non-folding portion does not necessarily mean that a corresponding component is rigid and thus is unable to be bent or curved, but may mean that the component has a relatively flat region compared to the folding portion 930 that may be folded or bent along the folding axis FAX.

The folding portion 930 may be bent between the first non-folding portion 910 and the second non-folding portion 920 such that the display module 900 may be folded. Here, the folding portion 930 may be bent in a U shape based on the folding axis FAX, as shown in FIG. 5. The first non-folding portion 910 and the second non-folding portion 920 may be continuously located at both sides of the folding portion 930, respectively.

The support portion 500 may be arranged on a surface of the display module 900, for example, a rear surface facing a display surface of the display module 900. The support portion 500 may support the display module 900. Here, an adhesive layer may be provided between the support portion 500 and the display module 900 to fix the support portion 500 to the display module 900.

There may be multiple support portions 500. Here, the support portions 500 may be spaced apart from each other. For example, the support portion 500 may include a first support portion 510 and a second support portion 520. Here, the first support portion 510 and the second support portion 520 may be the same as or similar to each other, and thus, the first support portion 510 is described in detail hereinafter.

The first support portion 510 may be formed in a plate shape and arranged to correspond to the first non-folding portion 910. Here, the first support portion 510 may be arranged to overlap the first non-folding portion 910 or overlap the first non-folding portion 910 and at least a part of the folding portion 930. Hereinafter, for convenience of description, a case where the first support portion 510 overlaps the first non-folding portion 910 and at least a part of the folding portion 930 is described in detail.

The first support portion 510 described above may be adhered to the first non-folding portion 910 to fix the first non-folding portion 910. On the other hand, a portion of the first support portion 510, which overlaps at least a part of the folding portion 930, may be separable from the at least a part of the folding portion 930 and thus may not restrict movement of the folding portion 930 in case that the folding portion 930 is folded. For example, the adhesive layer arranged between the first support portion 510 and the display module 900 may be arranged only between the first non-folding portion 910 and the first support portion 510 and may not be arranged between the folding portion 930 and the first support portion 510. Accordingly, because the folding portion 930 may not be adhered to the first support portion 510, the folding portion 930 may be separated from the first support portion 510 and thus may be freely bent in a required curvature without being restrained in case that the display module 900 is folded.

As shown in FIG. 4, the first support portion 510 and the second support portion 520 may be slightly spaced apart from each other based on the folding axis FAX. Accordingly, the first support portion 510 and second support portion 520 may support the first and second non-folding portions 910 and 920 and the folding portion 930, without interfering with each other in case that the display module 900 is unfolded.

The buffer portion 600 may be arranged on a surface of the support portion 500, for example, on a surface facing a surface where the display module 900 may be arranged. According to an embodiment, the buffer portion 600 may include at least one layer, and the at least one layer may include a buffer material. The buffer material may be a material having flexibility, resilience, or elasticity, for example, may include an elastic material such as rubber or silicon, and may be formed in a foam or cushion shape. Accordingly, the buffer portion 600 may relieve impact that may be applied to the display module 900 and the support portion 500.

The buffer portion 600 may be fixed to the support portion 500. For example, an adhesive layer (not shown) may be arranged between the support portion 500 and buffer portion 600, and the buffer portion 600 may be adhered and fixed to the support portion 500.

There may be multiple buffer portions 600. According to an embodiment, the buffer portion 600 may include a first buffer portion 610 and a second buffer portion 620. Here, the first buffer portion 610 and second buffer portion 620 may be the same as or similar to each other, and thus, the first buffer portion 610 is described in detail hereinafter.

The first buffer portion 610 may relieve impact from an external force applied to the display module 900 and the support portion 500. For example, the first buffer portion 610 may relieve impact applied to a part of the first non-folding portion 910 and a part of the first support portion 510.

The first buffer portion 610 and second buffer portion 620 may be spaced apart from each other based on the folding axis FAX. Here, a distance between an end of the first buffer portion 610 and an end of the second buffer portion 620, which face each other based on the folding axis FAX, may be greater than a distance between an end of the first support portion 510 and an end of the second support portion 520, which face each other based on the folding axis FAX. In other words, the end of the first buffer portion 610 may be arranged further out from the folding axis FAX than the end of the first support portion 510, and the end of the second buffer portion 620 may be arranged further out from the folding axis FAX than the end of the second support portion 520.

The cover portion 400 may be arranged at a side of the buffer portion 600, for example, a side facing a side where the display module 900 may be arranged, to cover the display module 900, the support portion 500, and the buffer portion 600.

According to an embodiment, the cover portion 400 may include a first cover 410 and a second cover 420. Here, the first cover 410 and the second cover 420 may be the same as or similar to each other, and thus, the first cover 410 is described in detail hereinafter.

The first cover 410 may be rotatably connected to the hinge portion 800 described below, thereby covering the first non-folding portion 910 of the display module 900 and a part of the folding portion 930 adjacent to the first non-folding portion 910. In detail, in case that the display module 900 is unfolded, the first cover 410 may be located parallel to the display module 900, thereby covering the display module 900 and the hinge portion 800. In case that the display module 900 is folded, the first cover 410 may rotate along a circumference of the hinge portion 800, thereby covering the display module 900 while externally exposing the hinge portion 800. Here, the first cover 410 may rotate to be slidable at an outer side of the hinge portion 800, i.e., at a side where the hinge portion 800 may be exposed to an external environment.

A portion of the cover portion 400 may be connected to the support portion 500. In detail, a portion of the first cover 410 and a portion of the second cover 420 may protrude between the first buffer portion 610 and second buffer portion 620 and may be connected to the first support portion 510 and second support portion 520, respectively. Accordingly, the cover portion 400 and the support portion 500 may move or rotate integrally with each other.

According to an embodiment, a second display panel 20 may be arranged on at least one of the first cover 410 and the second cover 420. Hereinafter, a case where the second display panel 20 may be arranged on the second cover 420 is described. The second display panel 20 may be arranged on a surface of the second cover 420. In detail, the second display panel 20 may be arranged on an outer side surface of the second cover 420, in particular, on a surface facing a surface that faces the display module 900. According to an embodiment, the second cover 420 may include a groove in the outer side surface of the second cover 420, to accommodate the second display panel 20, and the second display panel 20 may be arranged in the groove. The second display panel 20 may be substantially identical to the display panel 10.

According to another embodiment, the second display panel 20 may not be arranged on at least one of the first cover 410 and the second cover 420. Here, both the first cover 410 and the second cover 420 may not include a groove for accommodating the second display panel 20, like the first cover 410 shown in FIG. 4.

Hereinafter, for convenience of description, a case where the second display panel 20 may be arranged on at least one of the first cover 410 and the second cover 420 is described.

The hinge portion 800 may be arranged between the first cover 410 and the second cover 420 such that the first cover 410 and the second cover 420 may be rotatably connected. The hinge portion 800 may include a hinge structure 810 and a hinge cover 820.

According to an embodiment, the hinge structure 810 may include a first gear 811 and a second gear 812. The first and second gears 811 and 812 may be arranged to be accommodated in the hinge cover 820, or may be arranged inside a housing accommodating gears and the housing may be arranged in the hinge cover 820. Hereinafter, a case where the housing accommodates the first and second gears 811 and 812 therein and may be arranged in the hinge cover 820 is described. For convenience of description, FIGS. 4 and 5 are described without illustrating the housing.

Referring to FIGS. 4 and 5, the first gear 811 may rotate based on a first rotation shaft at a center thereof. The first rotation shaft may extend from the hinge structure 810 in a length direction of the hinge structure 810 (for example, the Y-direction of FIG. 4). Here, a first hinge plate 817 may be connected to the first rotation shaft. Accordingly, the first gear 811 and the first hinge plate 817 may rotate based on a same rotation shaft.

According to an embodiment, the first hinge plate 817 may be connected to the first support portion 510 and/or the first cover 410. For example, the first hinge plate 817 may be adhesively connected to the first support portion 510 or may be connected to the first cover 410 via a mechanical method using a bolt or the like. Accordingly, the first hinge plate 817 may rotate together in case that the first support portion 510 and/or the first cover 410 rotate. In case that the first cover 410 rotates to be folded, the first rotation shaft and the first gear 811 may move inside the hinge cover 820, and the first hinge plate 817 may rotate by being connected to the first cover 410.

The first hinge plate 817 may have different widths (for example, a length in the X-direction of FIG. 4) in a length direction (for example, the Y-direction of FIG. 4). In other words, the first hinge plate 817 may have a width further extended towards the folding axis FAX than shown in FIG. 5, at a point in the length direction (for example, the Y-direction of FIG. 4). In other words, as shown in FIG. 4, portions of the first hinge plate 817, where gears may be arranged, may have smaller widths to avoid interference between the first hinge plate 817 and the gears in case that the display device 1 is folded, and portions of the first hinge plate 817, where gears may not be arranged, may have widths extended adjacent to the folding axis FAX.

The second gear 812 may rotate based on a second rotation shaft at the center thereof. The second gear 812 and a second hinge plate 818 may be symmetrical to the first gear 811 and the first hinge plate 817, based on the folding axis FAX, and thus detailed descriptions thereof are omitted below.

According to an embodiment, sub-gears (not shown) may be provided between the first gear 811 and the second gear 812. For example, a first sub-gear may engage with the first gear 811 and a second sub-gear may engage with the second gear 812. The first sub-gear and the second sub-gear may engage with each other. Accordingly, in case that the first gear 811 rotates, rotation is transferred to the second sub-gear via the first sub-gear, and the second sub-gear may transfer the rotation to the second gear 812 again. In other words, in case that the first gear 811 rotates, the second gear 812 and the first gear 811 may simultaneously rotate.

The hinge cover 820 may be arranged to cover the hinge structure 810. In other words, the hinge structure 810 may be arranged between the hinge cover 820 and the display module 900.

According to an embodiment, the hinge cover 820 may be formed in a plate shape extending in a length direction (the Y-direction or −Y-direction of FIG. 4) of the hinge cover 820 and having a cross-section in a U shape. The hinge cover 820 may include a curved surface having a curvature. According to an embodiment, the hinge cover 820 may be arranged in an internal space formed by the first cover 410 and the second cover 420. In other words, as shown in FIG. 4, the first cover 410 and the second cover 420 may each have a concave curved surface at a region adjacent to the folding axis FAX, and the hinge cover 820 may be arranged at the concave curved surface. Here, shapes of the concave curved surfaces formed at the first cover 410 and the second cover 420 may correspond to a shape of the hinge cover 820. The shape of the concave curved surface of the first cover 410 may correspond to a shape of a portion (for example, the −X-direction of FIG. 4) of the hinge cover 820 arranged at the concave curved surface of the first cover 410. The shape of the concave curved surface of the second cover 420 may correspond to a shape of a portion (for example, the X-direction of FIG. 4) of the hinge cover 820 arranged at the concave curved surface of the second cover 420. Accordingly, the hinge cover 820 may enable the cover portion 400 to smoothly rotate along a circumference of the hinge cover 820.

Referring to FIG. 5, the display device 1 may be folded based on the folding axis FAX. For example, in case that an external force is applied to the cover portion 400, the first cover 410 and the second cover 420 may respectively rotate in directions (for example, a clockwise direction and a counterclockwise direction in FIG. 5) such that the first non-folding portion 910 and the second non-folding portion 920 face each other, along a circumference of the hinge cover 820. In case that the first cover 410 rotates, the first support portion 510, the first hinge plate 817, the first buffer portion 610, and the first non-folding portion 910 may also rotate together integrally with each other. In case that the second cover 420 rotates, the second support portion 520, the second hinge plate 818, the second buffer portion 620, and the second non-folding portion 920 may also rotate together integrally with each other. Also, as described above, according to an embodiment, in case that the first hinge plate 817 rotates, the first gear 811 rotates based on the first rotation shaft, and the second gear 812 may rotate by a same rotation angle via the first sub-gear engaged with the first gear 811 and the second sub-gear engaged with the first sub-gear. Accordingly, the first cover 410 and the second cover 420 may rotate by the same rotation angle.

Here, the folding portion 930 may be bent based on the folding axis FAX, as shown in FIG. 5. The folding portion 930 folded and bent may be located in a space formed by the hinge cover 820, the concave curved surface of the first cover 410, and the concave curved surface of the second cover 420. The first non-folding portion 910 and the second non-folding portion 920 may face each other.

The display device 1 may be unfolded again based on the folding axis FAX. This may be performed in a reverse manner of a folding process of the display device 1 described above.

Referring to FIGS. 4 and 5, the protection portion 700 may shield the hinge portion 800, in particular, an entire side surface of an exposed portion between the cover portion 400 and the hinge portion 800 by being connected to the hinge cover 820. The protection portion 700 may have an end connected to the first cover 410 and another end connected to the second cover 420. In particular, the protection portion 700 may prevent a foreign material from being introduced into the hinge portion 800, in detail, a gap between the hinge cover 820 and the cover portion 400, in case that the display device 1 is folded.

Figure 6:
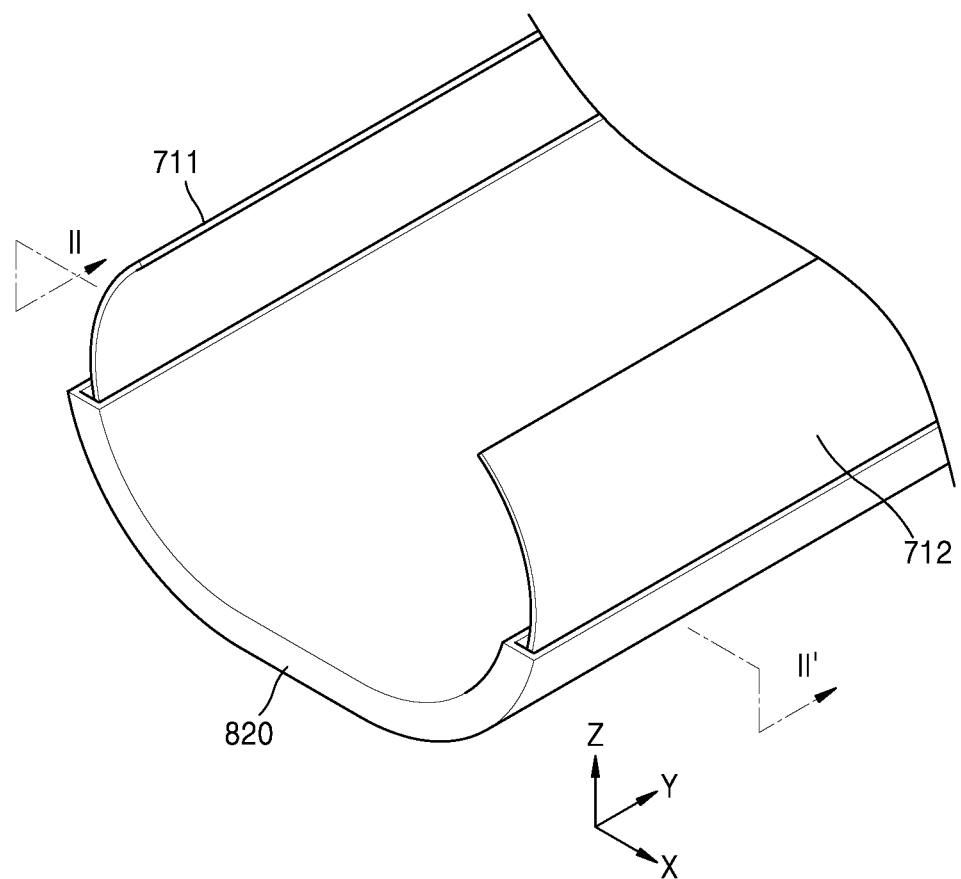
FIG. 6 is a schematic perspective view of a protection portion and a hinge portion, according to an embodiment of the disclosure.
Figure 7:
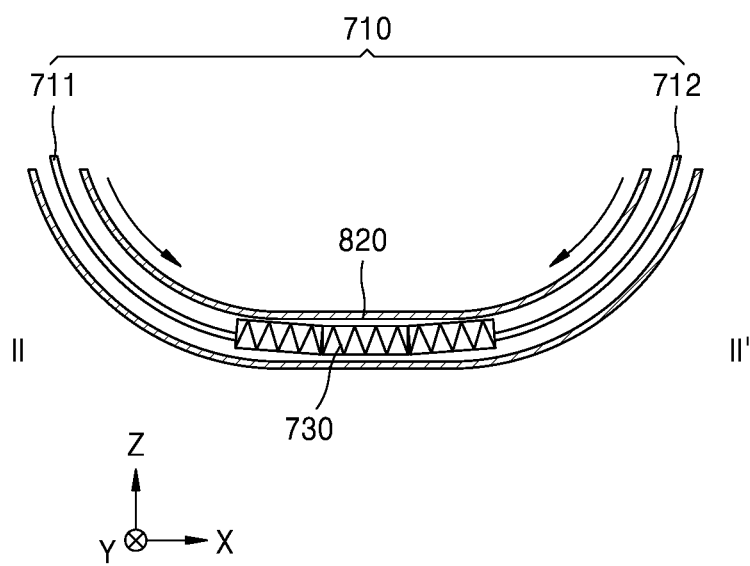
FIGS. 7 and 8 are schematic cross-sectional views of the protection portion and the hinge portion taken along line II-II' of FIG. 6.
Figure 8:
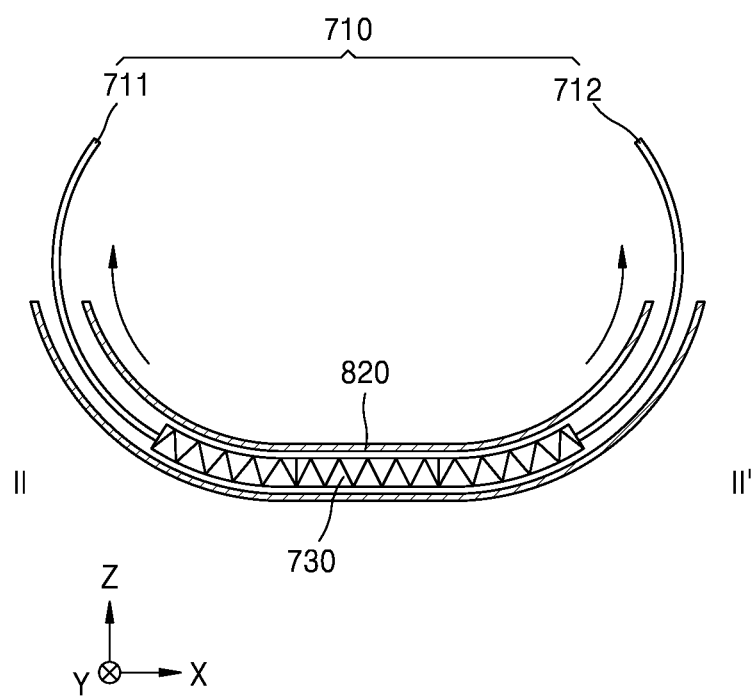

FIG. 6 is a schematic perspective view of the protection portion 700 and the hinge portion 800, according to an embodiment of the disclosure, and FIGS. 7 and 8 are schematic cross-sectional views of the protection portion 700 and the hinge portion 800 taken along line II-II' of FIG. 6. The protection portion 700 according to an embodiment of the disclosure will be described in detail with reference to FIGS. 6 through 8.

Referring to FIGS. 6 through 8, the protection portion 700 may shield the hinge portion 800, in particular, a space between the hinge portion 800 and the first cover 410 and a space between the hinge portion 800 and the second cover 420, by being connected to the hinge cover 820. The protection portion 700 may be formed in any of various shapes.

For example, the protection portion 700 may have a film shape connected to each of the hinge cover 820 and the first cover 410, and the hinge cover 820 and the second cover 420. The protection portion 700 may be formed of an elastic material, such as rubber, silicon, or the like, or a combination thereof. A length of the protection portion 700 may change as the first cover 410 and the second cover 420 move.

According to another embodiment, the protection portion 700 may be arranged inside the hinge cover 820. The protection portion 700 may be capable of being extended or contracted from the inside of the hinge cover 820, and the hinge cover 820 may form a space therein such that the protection portion 700 may be extracted or led in.

Hereinafter, for convenience of description, a case where the protection portion 700 may be capable of being extended or contracted from the inside of the hinge cover 820, and the hinge cover 820 may form the space therein such that the protection portion 700 may be extracted or led in will be described in detail.

According to an embodiment, the protection portion 700 may include an elastic portion 730 and a protection plate 710 connected to the elastic portion 730. The elastic portion 730 may be extended or contracted with elasticity. The elastic portion 730 may include, for example, a bar or plate including rubber, silicon, or the like having elasticity, or a spring having elasticity, or a combination thereof.

The elastic portion 730 may be arranged in an internal space of the hinge cover 820 and a portion thereof may be fixed to the hinge cover 820. The portion of the elastic portion 730 may be fixed to the hinge cover 820, and thus, the elastic portion 730 may be extended or contracted based on such a fixed point during extension or contraction.

According to an embodiment, the elastic portion 730 may be extended or contracted according to a curvature of the hinge cover 820. The elastic portion 730 may be extended or contracted according to the curvature of the hinge cover 820, in the internal space of the hinge cover 820, thereby moving the protection plate 710 connected to the elastic portion 730.

According to an embodiment, there may be multiple elastic portions 730. For example, the elastic portions 730 may be provided as springs arranged along a width direction (the X-direction or −X-direction in FIG. 7) of the hinge cover 820, as shown in FIG. 5, and the springs may be connected to each other.

Although not illustrated, the elastic portions 730 may be arranged by being spaced apart from each other in a length direction (the Y-direction or −Y-direction in FIG. 7) of the hinge cover 820. Here, the number of arranged elastic portions 730 may vary depending on a required extension and contraction force. For example, in case that a stronger extension and contraction force is required, a greater number of elastic portions 730 may be arranged by being spaced apart from each other along the length direction (the Y-direction or −Y-direction in FIG. 7) of the hinge cover 820.

Also, in case that the elastic portions 730 are spaced apart in the length direction (the Y-direction or −Y-direction in FIG. 7) of the hinge cover 820, the elastic portions 730 may be provided in the width direction (the X-direction or −X-direction in FIG. 8) of the hinge cover 820. In other words, the elastic portions 730 may form a column in the width direction (the X-direction or −X-direction in FIG. 7) of the hinge cover 820, and multiple such columns may be arranged in the length direction (the Y-direction or −Y-direction in FIG. 7) of the hinge cover 820.

The protection plate 710 may be connected to the elastic portion 730. The protection plate 710 may have a side connected to the cover portion 400 and another side connected to the elastic portion 730, and thus may move by extending or contracting the elastic portion 730 according to rotation of the cover portion 400. In detail, the protection plate 710 may include a first protection plate 711 connected to a side of the elastic portion 730 and a second protection plate 712 connected to another side of the elastic portion 730, according to an embodiment. The first protection plate 711 and the second protection plate 712 may be arranged in opposite directions based on the elastic portion 730. The first protection plate 711 and the second protection plate 712 may be the same as or similar to each other, and thus, the first protection plate 711 is described in detail hereinafter.

The first protection plate 711 may have a side connected to the first cover 410 (e.g., first combining portion 431, discussed more herein) and another side connected to the elastic portion 730. The first protection plate 711 may include a curved surface corresponding to a curved surface of the hinge cover 820. Accordingly, as shown in FIGS. 4 and 7, in case that the display device 1 is unfolded, the first protection plate 711 may be led in according to the curved surface of the hinge cover 820. At this time, the elastic portion 730 may be in a contracted state. Also, as shown in FIGS. 5 and 8, in case that the display device 1 is folded, the first protection plate 711 may be extracted according to the curved surface of the hinge cover 820. At this time, the elastic portion 730 may be in an extended state. In other words, in case that the display device 1 is folded, the first cover 410 rotates along an outer circumference of the hinge cover 820, and the first protection plate 711 having a side connected to the first cover 410 may extend the elastic portion 730 and be extracted from the hinge cover 820. Accordingly, an entire gap between the first cover 410 and the hinge cover 820 may be shielded, thereby preventing a foreign material from being inserted into the display module 900 from the outside.

As such, the protection portion 700 according to an embodiment of the disclosure may have a variable length by including the protection plate 710 and elastic portion 730 capable of being extended and contracted. Accordingly, the protection portion 700 may be led in the hinge cover 820 without the protection plate 710 being interfered or overlapped in case that the display device 1 is unfolded, and the protection plate 710 may be extracted from the hinge cover 820 in case that the display device 1 is folded.

According to an embodiment, the protection plate 710 may include a material having rigidity, for example, a metal.

According to an embodiment, the protection plate 710 may include an elastic material. The protection plate 710 including the elastic material may be slightly bent according to a curvature inside the hinge cover 820 by being connected to the elastic portion 730, and thus may be extracted and led in.

Although not illustrated, the protection portion 700 may include only the protection plate 710 including the elastic material, according to an embodiment. In detail, the protection plate 710 may be one or more plates arranged inside the hinge cover 820. For example, the protection plate 710 may be formed in a plate, and the protection plate 710 may have an end connected to the first cover 410 and another end connected to the second cover 420. Here, a length of the protection plate 710 including the elastic material during contraction may be materially the same as a length of a circumference of an arc of the hinge cover 820. In other embodiments, the protection plate 710 may include multiple plates, for example, the first protection plate 711 and the second protection plate 712, and the protection plates 711 and 712 may be connected between the hinge cover 820 and the first cover 410 and between the hinge cover 820 and the second cover 420, respectively. Here, the protection plate 710 including the elastic material may be led in the hinge cover 820 in case that the display device 1 is unfolded, and extracted from the hinge cover 820 as both sides are extended in case that the display device 1 is folded.

Figure 9:
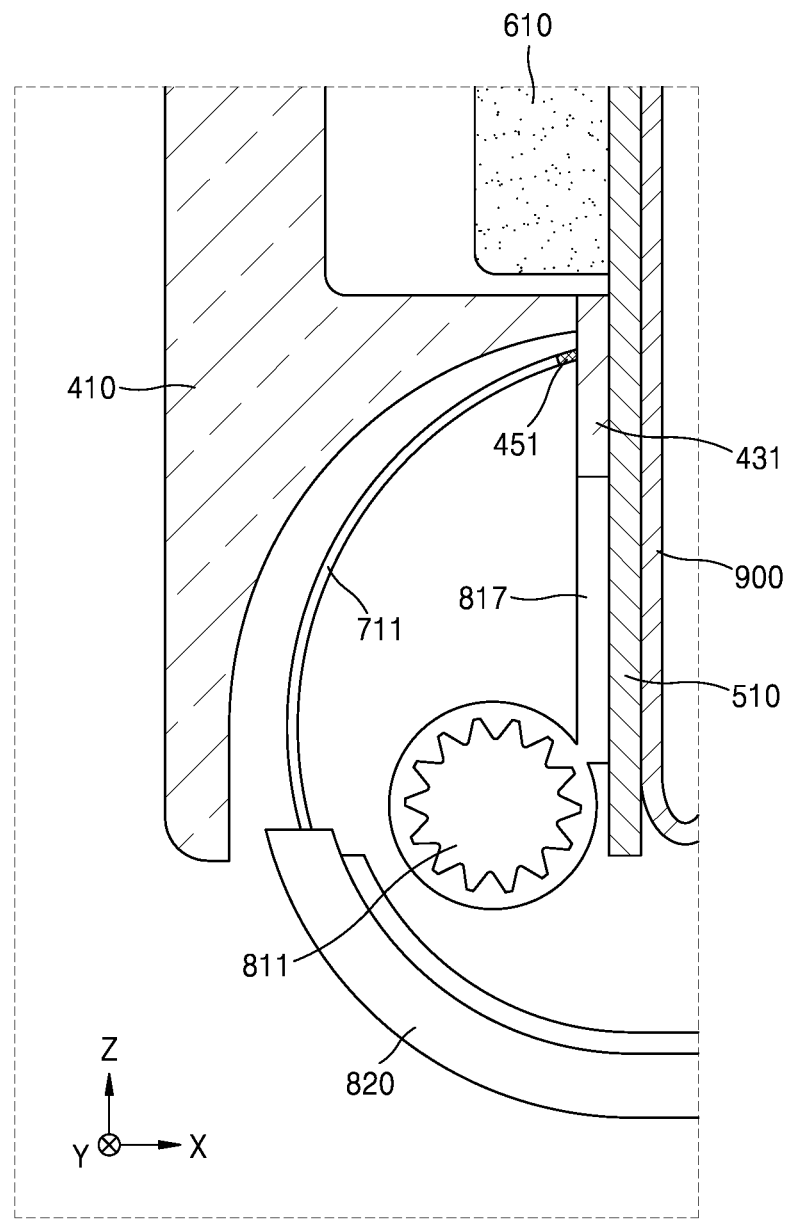
FIGS. 9 through 11 are schematic cross-sectional views of a protection plate and a combining portion, according to embodiments of the disclosure.
Figure 10:
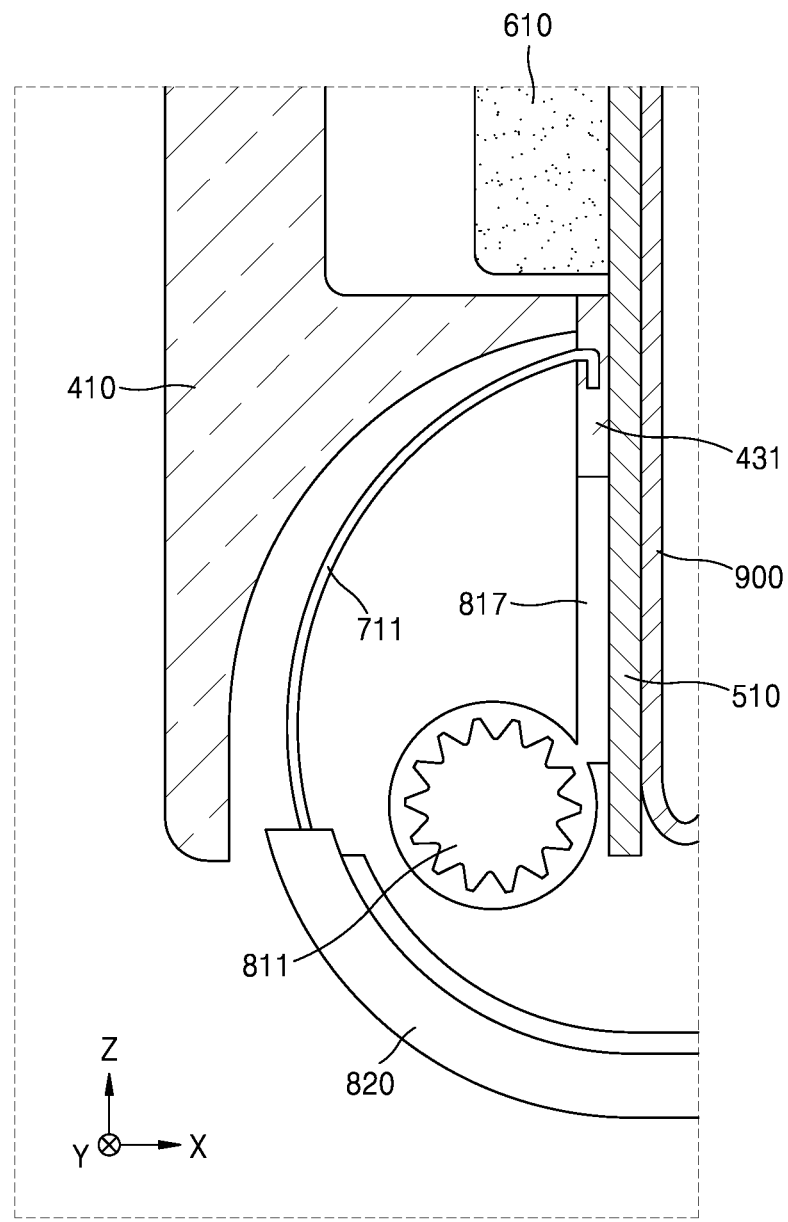
Figure 11:
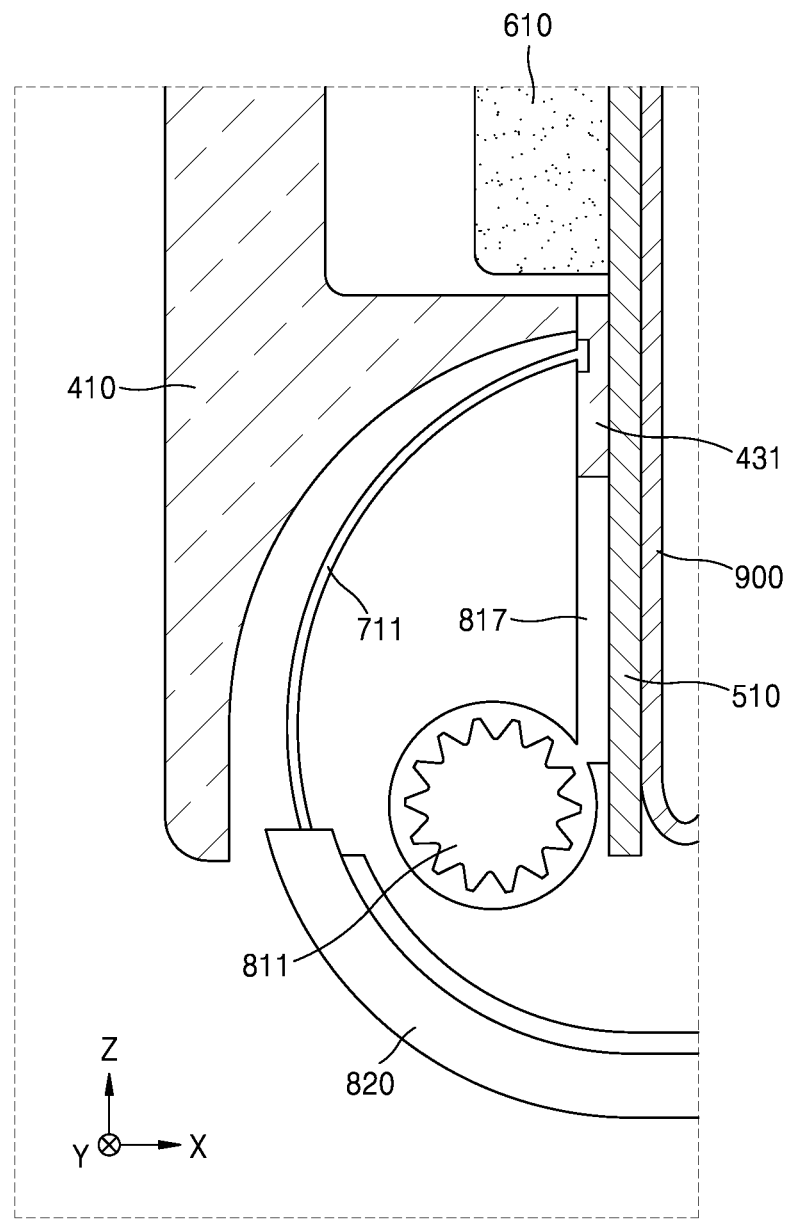

FIGS. 9 through 11 are schematic cross-sectional views of the protection plate 710 and a combining portion 430, according to embodiments of the disclosure. The combining portion 430 according to an embodiment of the disclosure will be described in detail with reference to FIGS. 9 through 11.

The cover portion 400 may include a combining portion 430 to which a portion of the protection plate 710 may be combined. The combining portion may be arranged at the cover portion 400 such that the cover portion 400 and the protection plate 710 may be connected to each other. According to an embodiment, the combining portion and the cover portion 400 may be integral with each other.

The combining portion 430 may include a first combining portion 431 arranged at the first cover 410 and a second combining portion (not shown) arranged at the second cover 420. The first combining portion 431 and the second combining portion may have symmetrical arrangements and shapes and may have the same or similar functions, and thus, the first combining portion 431 will be described with reference to FIGS. 9 through 11.

The first combining portion 431 may be arranged at the first cover 410. In detail, the first combining portion 431 may be arranged at a concave curved surface of the first cover 410. Accordingly, in case that the first cover 410 rotates along a circumference of the hinge cover 820, the first protection plate 711 connected to the first combining portion 431 arranged at the curved surface of the first cover 410 may be smoothly extracted along the curved surface of the first cover 410. Also, the hinge cover 820, the first protection plate 711, the first combining portion 431, and the curved surface of the first cover 410 may form a shield surface, thereby completely shielding a side portion of the display device 1 such that a foreign material may not be introduced into the display device 1.

According to an embodiment, the combining portion 430 may protrude from the concave curved surface of the cover portion 400. For example, the first combining portion 431 may protrude from the concave curved surface of the first cover 410, in parallel to the first support portion 510. Here, the first combining portion 431 may be connected to the first support portion 510. Accordingly, the first protection plate 711 may be connected to the protruding first combining portion 431, and thus, the first protection plate 711 may be connected to the first cover 410 while maintaining a shape corresponding to the hinge cover 820 and the curved surface of the first cover 410. Also, the first combining portion 431 may not only provide combination between the first protection plate 711 and the first cover 410, but also provide combination between the first cover 410 and the first support portion 510.

A portion of the first protection plate 711 may be combined to the first combining portion 431. An end of the first protection plate 711 may be combined and fixed to the first combining portion 431, and thus, the first protection plate 711 may be extracted or led in according to rotation and movement of the first cover 410.

Referring to FIG. 9, the first combining portion 431 may be connected to the first protection plate 711 via adhesion, according to an embodiment. Here, a first adhesive layer 451 may be arranged between the first protection plate 711 and the first combining portion 431 to fix the first protection plate 711. The end of the first protection plate 711 may be adhered to the first adhesive layer 451 and connected to the first combining portion 431. Also, although not illustrated, the end of the first protection plate 711 may be formed in a T shape to form a wider adhesive area, so as to secure an area for adhesion.

Referring to FIGS. 10 and 11, the first combining portion 431 may be connected to the first protection plate 711 via insertion, according to an embodiment. In detail, the end of the first protection plate 711 fixed to the first combining portion 431 may be bent in a direction from the first protection plate 711. Here, the first combining portion 431 may include a groove for accommodating the end of the first protection plate 711. The bent end of the first protection plate 711 may be inserted into the groove, thereby increasing a combining force between the first protection plate 711 and the first combining portion 431 and preventing the first protection plate 711 from deviating from the first combining portion 431.

Here, the end of the first protection plate 711 fixed to the first combining portion 431 may be bent in a direction, for example, a direction facing the folding portion 930 (a −Z-direction in FIG. 10), as shown in FIG. 10. As such, the end of the first protection plate 711 may be bent in a direction opposite to a direction of a centrifugal force applied in case that the first cover 410 is rotated. Accordingly, a reaction of a force of the first cover 410 to move in a rotation radius direction due to an effect of the centrifugal force during rotation may be applied to the bent end of the first protection plate 711. Accordingly, the combining force of the first protection plate 711 and the first combining portion 431 (or the first cover 410) may be increased.

In other embodiments, the end of the first protection plate 711 fixed to the first combining portion 431 may be bent in opposite directions, for example, the direction facing the folding portion 930 (the −Z-direction in FIG. 10) and an opposite direction thereof, as shown in FIG. 11. Accordingly, the first protection plate 711 may not only have an increased combining force with the first combining portion 431 according to the centrifugal force of the first cover 410, but also have an increased combining force with the first combining portion 431 even in case that the first cover 410 is stopped without being rotated.

Figure 12:
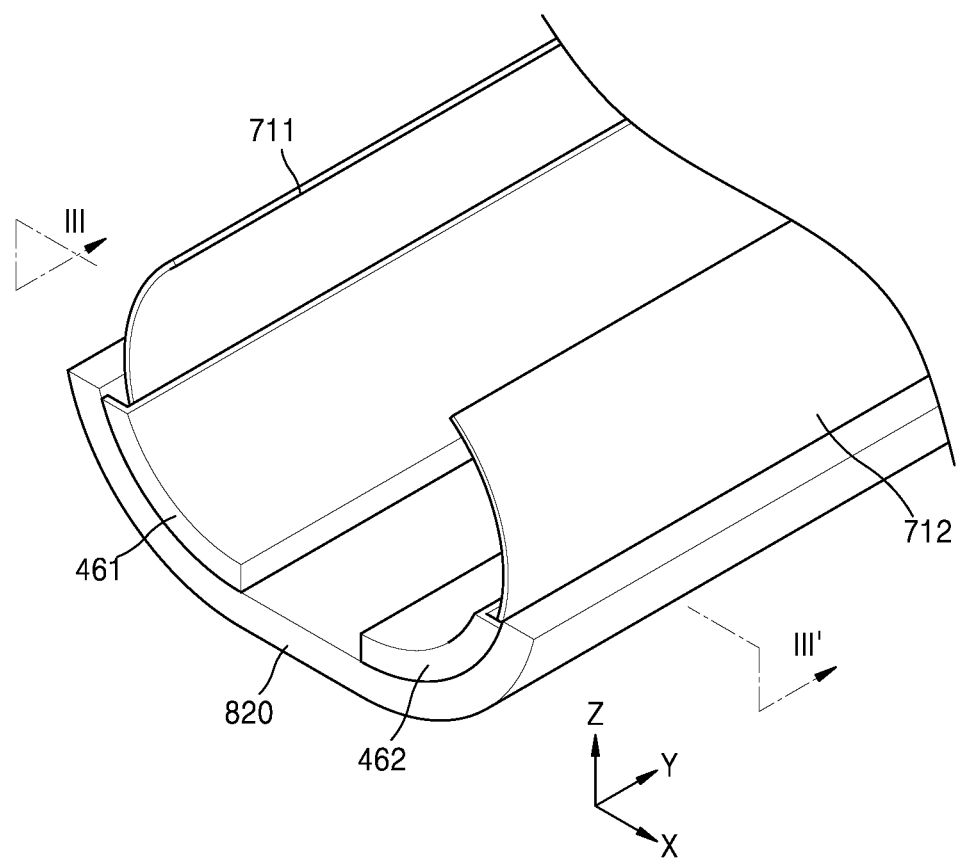
FIG. 12 is a schematic perspective view of a protection portion and a hinge portion, according to another embodiment of the disclosure.
Figure 13:
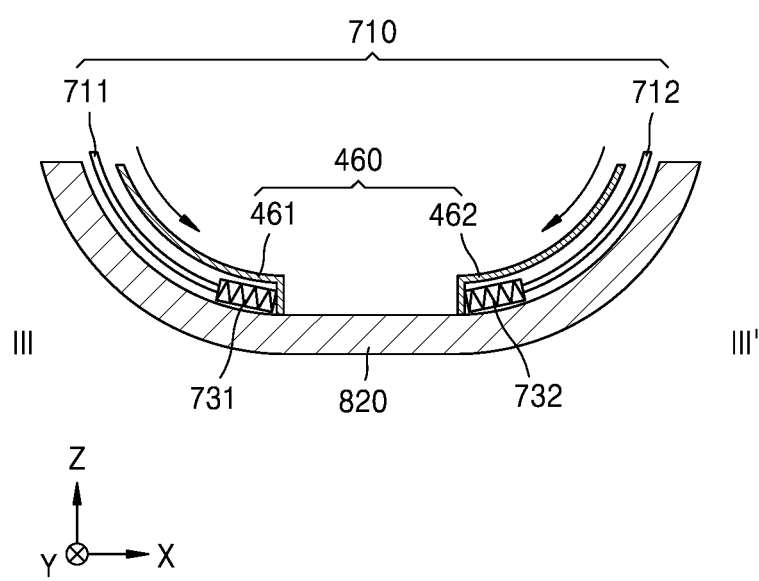
FIGS. 13 and 14 are schematic cross-sectional views of the protection portion and the hinge portion taken along line III-III' of FIG. 12.
Figure 14:
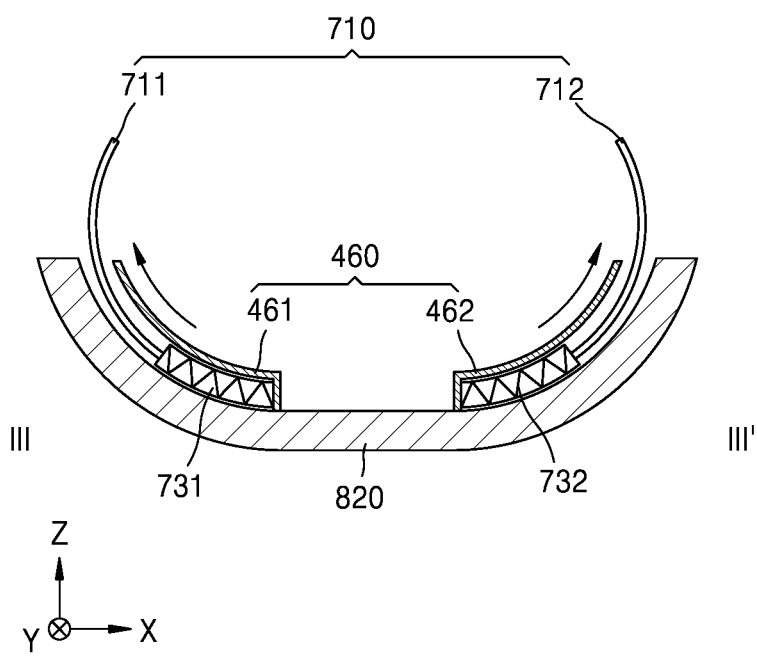

FIG. 12 is a schematic perspective view of the protection portion 700 and the hinge portion 800, according to another embodiment of the disclosure, and FIGS. 13 and 14 are schematic cross-sectional views of the protection portion 700 and the hinge portion 800 taken along line III-Ill' of FIG. 12.

FIGS. 12 through 14 illustrates the protection portion 700 according to another embodiment of the disclosure. Hereinbelow, details that may be the same as those of the above embodiments are omitted, and differences will be described.

Referring to FIGS. 12 and 14, the protection portion 700 according to another embodiment of the disclosure may be arranged on an inner side surface of the hinge cover 820. Here, the inner side surface of the hinge cover 820 may denote a surface at a side in a bent direction in case that the hinge cover 820 has a bent shape with a curvature, and an outer side surface of the hinge cover 820 may denote a surface at a side opposite to the direction the hinge cover 820 may be bent, i.e., a surface opposite to the inner side surface. Here, the protection portion 700 may be arranged between the hinge cover 820 and the hinge structure 810.

The protection portion 700 may include the elastic portion 730 and the protection plate 710 connected to the elastic portion 730. According to an embodiment, the elastic portion 730 may include a first elastic portion 731 arranged at the hinge cover 820 and a second elastic portion 732 arranged in a direction opposite to the first elastic portion 731, in a circumferential direction of the hinge cover 820. Here, the first elastic portion 731 and second elastic portion 732 may be spaced apart from each other in the circumferential direction of the hinge cover 820. In detail, the first elastic portion 731 may be arranged at a side (for example, the −X-direction in FIG. 14), based on a center of the hinge cover 820 that may be symmetric. The second elastic portion 732 may be arranged at another side (for example, the X-direction in FIG. 14), based on the center of the hinge cover 820 that may be symmetric.

The first protection plate 711 may be connected to the first elastic portion 731 and the second protection plate 712 may be connected to the second elastic portion 732. Accordingly, as described above, the protection plate 710 may enable the elastic portion 730 to be extended and contracted according to rotation of the cover portion 400, and thus may be extracted or led in by sliding along the inner side surface of the hinge cover 820.

According to an embodiment, the hinge cover 820 may include a guide portion 460 guiding an extraction and lead-in path of the protection plate 710. The guide portion 460 may include a first guide 461 guiding a path of the first protection plate 711 and a second guide 462 guiding a path of the second protection plate 712.

According to an embodiment, the guide portion 460 may have a curved surface corresponding to the curved surface of the hinge cover 820. Accordingly, the elastic portion 730 and protection plate 710 may smoothly move along the curved surface of the hinge cover 820 without being interfered by the guide portion 460.

Referring to FIGS. 12 through 14, the guide portion 460 according to an embodiment may be arranged to cover the elastic portion 730 and protection plate 710. The guide portion 460 may not only cover the elastic portion 730, but also save the protection plate 710 by being extended along the inner side surface of the hinge cover 820 while being spaced apart from the inner side surface of the hinge cover 820. Accordingly, the guide portion 460 may prevent the elastic portion 730 and protection plate 710, in particular, the protection plate 710, from deviating from the path during movement. Also, the guide portion 460 may also perform a function of accommodating the elastic portion 730, and thus, the elastic portion 730 may be accommodated inside the guide portion 460 without having to use a separate accommodating housing.

A display device according to an embodiment of the disclosure may include a protection portion to prevent a foreign material from being inserted into the display device.

In the display device according to an embodiment of the disclosure, the protection portion moves together with a cover portion according to rotation of the cover portion to shield a portion exposed between the cover portion and a hinge portion, and thus foreign material insertion may be prevented.

In the display device according to an embodiment of the disclosure, the protection portion includes an elastic portion and protection plates, and thus a foreign material may be prevented from being inserted into the display device without interference between the protection plates.

The effects of the disclosure are not limited to those mentioned above, and other effects that are not mentioned may be clearly understood by one of ordinary skill in the art from the disclosure.

It should be understood that embodiments described herein should be considered in a descriptive sense only and not for purposes of limitation. Descriptions of features or aspects within each embodiment should typically be considered as available for other features or aspects in other embodiments. While one or more embodiments have been described with reference to the figures, it will be understood by those of ordinary skill in the art that various changes in form and details may be made therein without departing from the spirit and scope of this disclosure.

What is claimed is:

1. A display device comprising:
   a foldable display panel;
   a cover portion where the foldable display panel is disposed, the cover portion overlapping the foldable display panel;

a hinge portion comprising:
a hinge structure foldably connected to the cover portion; and
a hinge cover where the hinge structure is disposed; and
a protection portion connected to the hinge portion and shielding an exposed side surface between the cover portion and the hinge portion,
wherein the protection portion comprises:
an elastic portion that extends or contracts with elasticity; and
a protection plate having an end extending from an end of the elastic portion, the on plate being connected to the cover portion.

2. The display device of claim 1, wherein another end of the protection portion is fixed to the cover portion.

3. The display device of claim 1, wherein the protection portion is disposed in an internal space of the hinge cover.

4. The display device of claim 1, wherein
the protection portion is extracted from the hinge cover in case that the display device is folded, and
the protection portion is led into the hinge cover in case that the display device is unfolded.

5. The display device of claim 1, wherein the protection portion comprises an elastic material.

6. The display device of claim 1, wherein the protection plate comprises:
a first protection plate connected to the elastic portion; and
a second protection plate disposed in a direction opposite to the first protection plate and connected to the elastic portion.

7. The display device of claim 1, wherein the elastic portion is disposed inside the hinge cover.

8. The display device of claim 1, wherein the elastic portion is extended along a curvature of the hinge cover.

9. The display device of claim 1, further comprising an adhesive layer between the protection plate and the cover portion to fix the protection portion to the cover portion.

10. The display device of claim 1, wherein the cover portion comprises a combining portion with which a portion of the protection plate is combined.

11. The display device of claim 10, wherein:
the cover portion comprises a curved surface corresponding to a curved surface of the hinge cover, and
the combining portion is disposed at the curved surface of the cover portion.

12. The display device of claim 1, wherein another end of the protection plate is fixed to the cover portion and bent in a direction from the protection plate.

13. The display device of claim 1, wherein the elastic portion comprises:
a first elastic portion disposed at the hinge cover; and
a second elastic portion disposed in a direction opposite to the first elastic portion, in a circumferential direction of the hinge cover.

14. The display device of claim 13, wherein the hinge cover comprises a guide portion that guides an extraction and lead-in path of the protection plate.

15. The display device of claim 1, wherein:
the protection portion has a curvature, and
the curvature of the protection portion and a curvature of the hinge cover are the same.

16. A display device comprising:
a display panel comprising a first non-folding portion, a second non-folding portion, and a folding portion between the first non-folding portion and the second non-folding portion;
a cover portion comprising:
a first cover overlapping the first non-folding portion of the display panel; and
a second cover overlapping the second non-folding portion of the display panel;
a hinge portion overlapping the folding portion of the display panel and foldably connecting the first cover to the second cover; and
a protection portion disposed at the hinge portion, the protection portion connecting the first cover and the second cover to the hinge portion, and having a variable length,
wherein the protection portion comprises:
an elastic portion extendedly fixed to the hinge portion; and
a protection plate having an end extending from an end of the elastic portion, the protection plate being connected to the first cover and the second cover.

17. The display device of claim 16, wherein the protection portion shields an exposed side surface between the cover portion and the hinge portion.

18. The display device of claim 16, wherein
the protection plate is extracted from the hinge portion in case that the display device is folded, and
the protection plate is led into the hinge portion in case that the display device is unfolded.

* * * * *